United States Patent
Gu et al.

(10) Patent No.: US 10,941,642 B2
(45) Date of Patent: Mar. 9, 2021

(54) STRUCTURE FOR FLUID FLOWBACK CONTROL DECISION MAKING AND OPTIMIZATION

(71) Applicant: Halliburton Energy Services, Inc., Houston, TX (US)

(72) Inventors: Qiuying Gu, Humble, TX (US); Jason D. Dykstra, Spring, TX (US); Zhijie Sun, Spring, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 558 days.

(21) Appl. No.: 15/577,380

(22) PCT Filed: Jul. 17, 2015

(86) PCT No.: PCT/US2015/041012
§ 371 (c)(1),
(2) Date: Nov. 28, 2017

(87) PCT Pub. No.: WO2017/014732
PCT Pub. Date: Jan. 26, 2017

(65) Prior Publication Data
US 2018/0171769 A1    Jun. 21, 2018

(51) Int. Cl.
*G06G 7/48* (2006.01)
*E21B 43/267* (2006.01)
(Continued)

(52) U.S. Cl.
CPC .......... *E21B 43/267* (2013.01); *E21B 49/008* (2013.01); *G06F 30/20* (2020.01); *E21B 2200/22* (2020.05)

(58) Field of Classification Search
CPC .............. E21B 43/267; E21B 49/008; E21B 2041/0028; E21B 2200/22; G06F 17/5009; G06F 30/20
See application file for complete search history.

(56) References Cited

U.S. PATENT DOCUMENTS 5,050,674 A  9/1991 Soliman et al.
5,501,275 A  3/1996 Roger et al.
(Continued)

FOREIGN PATENT DOCUMENTS

WO  WO 2003/014524 A1  2/2003
WO  WO 2015/030837 A1  3/2015

OTHER PUBLICATIONS

Hu, Jinghong, et al. "Acidizing flowback optimization for tight sandstone gas reservoirs." Journal of Natural Gas Science and Engineering 24 (2015): 311-316.*
(Continued)

*Primary Examiner* — Rehana Perveen
*Assistant Examiner* — Nithya J Moll
(74) *Attorney, Agent, or Firm* — Haynes and Boone, LLP

(57) ABSTRACT

Methods and systems are presented in this disclosure for evaluating whether to apply fluid flowback during a fracture closure stage of a hydraulic fracturing operation of a reservoir formation. Information collected prior to the fracture closure stage of the hydraulic fracturing operation can be first gathered. Based on the collected information, it can be determined whether to perform fluid flowback during the fracture closure stage following a treatment stage of the fracturing operation. Based on the determination, a rate of the fluid flowback can be adjusted and optimized in real-time during the fracture closure stage.

20 Claims, 6 Drawing Sheets

(51) Int. Cl.
    *G06F 30/20*    (2020.01)
    *E21B 49/00*    (2006.01)

(56)                References Cited

U.S. PATENT DOCUMENTS

| | | | |
|---|---|---|---|
| 5,908,073 | A | 6/1999 | Nguyen et al. |
| 5,924,488 | A | 7/1999 | Nguyen et al. |
| 6,047,772 | A * | 4/2000 | Weaver ................ C09K 8/5086 |
| | | | 166/276 |
| 6,364,015 | B1 | 4/2002 | Upchurch |
| 2006/0035790 | A1* | 2/2006 | Okell .................... C09K 8/805 |
| | | | 507/269 |
| 2007/0137859 | A1* | 6/2007 | Abass .................. E21B 43/267 |
| | | | 166/250.1 |
| 2008/0133193 | A1* | 6/2008 | Gdanski ................ E21B 43/26 |
| | | | 703/10 |
| 2014/0151062 | A1* | 6/2014 | Stephenson ............ E21B 43/12 |
| | | | 166/373 |
| 2015/0075779 | A1* | 3/2015 | Walters ................ E21B 49/008 |
| | | | 166/250.1 |
| 2018/0010429 | A1* | 1/2018 | Willberg ............... E21B 49/005 |

OTHER PUBLICATIONS

Canon et al., "Avoiding Proppant Flowback in Tight-Gas Completions with Improved Fracture Design," SPE Annual Technical Conference and Exhibition, Oct. 5-8, 2003, Denver, Colorado, USA.

International Search Report and The Written Opinion of the International Search Authority, or the Declaration, dated Apr. 26, 2016, PCT/US2015/041012, 14 pages, ISA/KR.

* cited by examiner

STRUCTURE FOR FLUID FLOWBACK CONTROL DECISION MAKING AND OPTIMIZATION

PRIORITY

The present application is a U.S. National Stage patent application of International Patent Application No. PCT/US2015/041012, filed on Jul. 10, 2017, the benefit of which is claimed and the disclosure of which is incorporated herein by reference in its entirety.

TECHNICAL FIELD

The present disclosure generally relates to a method for controlling a hydraulic fracturing operation and, more particularly, to a framework structure for fluid flowback control and optimization during fracture closure.

BACKGROUND

Hydrocarbon-producing wells are often stimulated by hydraulic fracturing treatments. In hydraulic fracturing operations, a viscous fracturing fluid, which also functions as a carrier fluid, is pumped into a producing formation zone during an injection or treatment stage at a rate and pressure such that one or more fractures are formed in the zone. Typically, particulates, such as graded sand, suspended in a portion of the fracturing fluid are then deposited in the fractures when the fracturing fluid is converted to a thin fluid to be returned to the surface. These particulate solids, or "proppant particulates," serve to prevent the fractures from fully closing so that conductive channels are formed through which produced hydrocarbons can flow. Once fracturing has occurred, in a fracture closure stage, the pressure of the injected fluid is decreased to below the closure pressure of the formation.

One phenomenon that can occur during the fracture closure stage is flowback, where proppant is transported out of the fractures and formation, carried by the flowing formation fluids and carrier fluid as the well is allowed to produce. Proppant crushing after the fracturing treatment stage has ended can also occur as the associated fracturing pressure is bled off, i.e., the fracture closure stage, leading to the loss of fracture conductivity as crushed proppant inhibits flow. Additionally, in certain low permeability reservoirs, due to the characteristic low leak-off rates of treatment fluids to the formation, a previously suspended proppant may settle to the fracture bottom before it can be trapped between fracture walls, if the fracture walls take too much time to close.

Often times, it is necessary to balance these various phenomenons. For example, by allowing proppant to flowback into the wellbore with formation and treatment fluids, the amount of undesired proppant settling may be decreased. However, in such case, the amount of proppant loss from the formation fractures back to the wellbore would potentially increase. Therefore, it is desirable to optimize flowback, and to calculate a preferred flowback rate of treatment fluids during fracture closure.

BRIEF DESCRIPTION OF THE DRAWINGS

Various embodiments of the present disclosure will be understood more fully from the detailed description given below and from the accompanying drawings of various embodiments of the disclosure. In the drawings, like reference numbers may indicate identical or functionally similar elements.

DETAILED DESCRIPTION

Figure 1A:
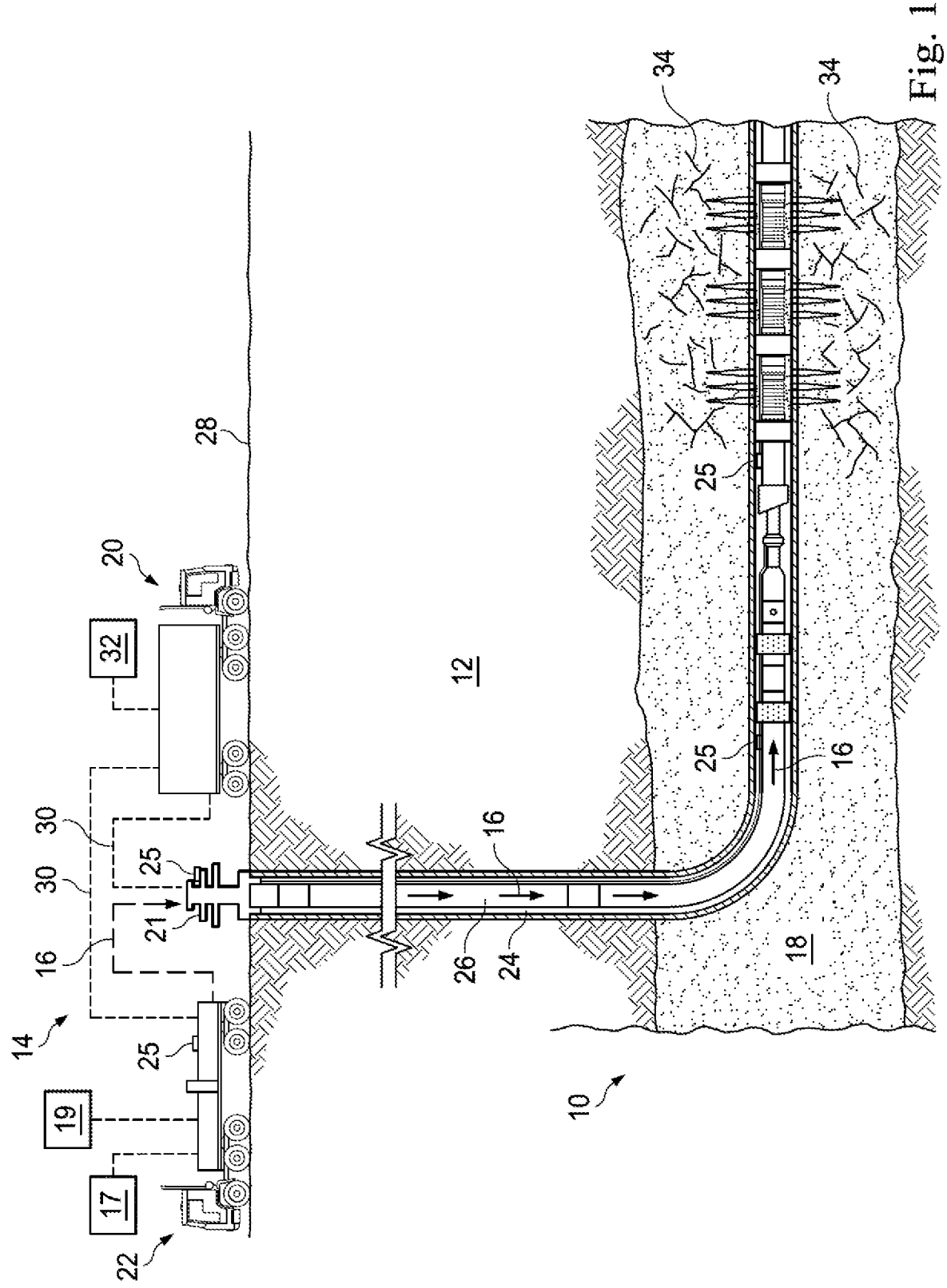
FIG. 1A is a diagram of an example well fracturing system for applying a fracture treatment to a subterranean formation, according to certain embodiments of the present disclosure.

Embodiments of the present disclosure relate to a framework for optimizing treatment fluid flowback during a fracture closure stage of a hydraulic fracturing operation, and thereafter, controlling the flowback to achieve a desired objective. While the present disclosure is described herein with reference to illustrative embodiments for particular applications, it should be understood that embodiments are not limited thereto. Other embodiments are possible, and modifications can be made to the embodiments within the spirit and scope of the teachings herein and additional fields in which the embodiments would be of significant utility.

In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described. It would also be apparent to one skilled in the relevant art that the embodiments, as described herein, can be implemented in many different embodiments of software, hardware, firmware, and/or the entities illustrated in the figures. Any actual software code with the specialized control of hardware to implement embodiments is not limiting of the detailed description. Thus, the operational behavior of embodiments will be described with the understanding that modifications and variations of the embodiments are possible, given the level of detail presented herein.

The foregoing disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper," "uphole," "downhole," "upstream," "downstream," and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. For example, if the apparatus in the figures is turned over, elements described as being "below" or "beneath" other elements or features would then be oriented "above" the other elements or features. Thus, the exemplary term "below" may encompass both an orientation of above and below. The apparatus may be otherwise oriented (rotated 90 degrees or at other orientations) and the spatially relative descriptors used herein may likewise be interpreted accordingly.

Illustrative embodiments and related methods of the present disclosure are described below in reference to FIGS. 1-7 as they might be employed for performing fluid flowback control and optimization during a fracture closure stage of a hydraulic fracturing operation. Such embodiments and related methods may be practiced, for example, using a computer system as described herein. Other features and advantages of the disclosed embodiments will be or will become apparent to one of ordinary skill in the art upon examination of the following figures and detailed description. It is intended that all such additional features and advantages be included within the scope of the disclosed embodiments. Further, the illustrated figures are only exemplary and are not intended to assert or imply any limitation with regard to the environment, architecture, design, or process in which different embodiments may be implemented.

An intelligent decision making method, referred to as an expert system, is presented in this disclosure for evaluating the necessity of applying forced flowback of a treatment fluid during a fracture closure stage of a hydraulic fracturing operation. The evaluation may be based at least in part upon local formation properties and a system behavior during a fracture treatment stage preceding the fracture closure stage. Furthermore, an optimization and control structure, referred to as a flowback control framework, is provided for real-time adjustment of a fluid flowback rate in order to effect a desired fracture closure time and propped fracture geometry. With the flowback control framework presented in this disclosure, a user-defined objective function may be optimized. For example, in embodiments, the user-defined objective function may be related to maximizing an expected production over a well lifetime. In other embodiments, the user-defined objective function may be related to minimizing effects of proppant crushing, settling, and/or proppant flowback into a wellbore on the final fracture conductivity.

In one or more embodiments, the decision making expert system presented in this disclosure may be configured to determine whether or not to flowback a treatment fluid during fracture closure. If the fluid flowback is deemed necessary (e.g., determined by the expert system), an optimization and control framework may be configured to adjust fluid flowback parameters. Such parameters may include pressure and/or flow rate. In one or more embodiments, adjustments to the fluid flowback rate may be made in real-time during the fracture closure in order to take advantage of updated system measurements obtained during this operation.

FIG. 1A is a diagram of an example well fracturing system 10 for applying a fracture treatment to a subterranean formation 12. Fracture treatments may be used, for example, to form or propagate fractures in a rock layer by injecting pressurized fluid. The fracture treatment may enhance or otherwise influence production of petroleum, natural gas, coal seam gas, or other types of reservoir resources. Fracture treatments may be used for other purposes. The example well fracturing system 10 includes a reservoir 18 in the subterranean formation 12 and an injection system 14 that applies fracturing fluid 16 from a fracturing fluid source 17 to the reservoir 18. The injection system 14 includes control trucks 20, pump trucks 22, a wellbore 24, a working string 26 and other equipment. In the example shown in FIG. 1A, the pump trucks 22, the control trucks 20 and other related equipment are above the surface 28, and the wellbore 24, the working string 26, and other equipment are beneath the surface 28. An injection system can be configured as shown in FIG. 1A or in a different manner, and may include additional or different features as appropriate. The injection system 14 may be deployed in any suitable environment, for example, via skid equipment, a marine vessel, sub-sea deployed equipment, or other types of equipment.

The wellbore 24 can include both vertical and horizontal sections, such as shown in FIG. 1A, and the fracturing fluid 16 is applied to the reservoir 18, which resides near the wellbore 24. Generally, a wellbore may include horizontal, vertical, slant, curved, and other types of wellbore geometries and orientations, and the fracture treatment may generally be applied to any portion of a subterranean formation 12. The wellbore 24 can include a casing that is cemented or otherwise secured to the wellbore wall. The wellbore 24 can be uncased or include uncased sections. Perforations can be formed in the casing to allow fracturing fluids and/or other materials to flow into the reservoir 18. Perforations can be formed using shape charges, a perforating gun, and/or other tools.

The pump trucks 22 may include mobile vehicles, immobile installations, skids, hoses, tubes, fluid tanks or reservoirs, blenders, pumps, valves, and/or other suitable structures and equipment. The pump trucks 22 can communicate with the control trucks 20, for example, by a communication link 30. The pump trucks 22 are coupled via a wellhead 21 to the working string 26 to communicate the fracturing fluid 16 into the wellbore 24. The working string 26 may include coiled tubing, sectioned pipe, and/or other structures that communicate fluid through the wellbore 24. The working string 26 can include flow control devices, bypass valves, ports, and or other tools or well devices that control the flow of fluid from the interior of the working string 26 into the reservoir 18.

The fracturing fluid 16 can include any appropriate fluid or fluid composition. For example, the fracturing fluid 16 can include hydraulic fracturing fluids, chemical treatment fluids, and other types of fluids. The fracturing fluid 16 may include proppant-laden fluids, thin fluids, gels, foams, additives, water, slurry, liquids, gases or any suitable combination. The techniques described here may be used to model the flow of fluids that are injected for purposes other than fracturing. As such, the fracturing fluid 16 may generally include fluids injected for applying fracture treatments, chemical treatments, heat treatments, or any suitable combination of these and other fluids. For illustrative purposes only a proppant source 19 is shown in flow communication with pump truck 22.

The control trucks 20 can include mobile vehicles, immobile installations, and/or other suitable structures. Control truck 20 may be integrated with pump truck 22, and may be coupled to the wellhead 21. The control trucks 20 can control and/or monitor the injection treatment. For example, the control trucks 20 may include communication links 30 that allow the control trucks 20 to communicate with tools, sensors, and/or other devices installed in the wellbore 24 or at the surface, such as sensors 25. The control trucks 20 may receive data from, or otherwise communicate with, a computing system 32 that models one or more aspects of the fracture treatment. In addition, the control trucks 20 may include communication links that allow the control trucks 20 to communicate with the pump trucks 22 and/or other systems. The control trucks 20 may include an injection control system that controls the flow of the fracturing fluid 16 into the reservoir 18. For example, the control trucks 20 may monitor and/or control the density, volume, flow rate, flow pressure, location, proppant, flowback and/or other properties of the fracturing fluid 16 injected into the reservoir 18.

The reservoir 18 can include a fracture network 34, as shown in FIG. 1A. Some or all of the fracture network 34 can be selected for analysis by the computing system 32. For example, given an area (e.g., surrounding the wellbore 24), a subset of the area (e.g., defined by a selected width, depth, and length) or all of the area can be modeled by the computing system 32.

In one aspect of operation, the injection system 14 applies a fracture treatment to the reservoir 18. The control truck 20 controls and monitors the pump truck 22, which pumps the fracturing fluid 16 through the work string 26, into the wellbore 24, and subsequently into the reservoir 18. The fracturing fluid 16 can be injected at a pressure that fractures the reservoir media in the reservoir 18. Some aspects of the fracture treatment may be selected, tuned, or otherwise parameterized based on information provided by the computing system 32, in real time or based on prior treatments (e.g., prior treatments in similar settings, etc.). For example, the fracture treatment may be designed based or adjusted in real time in part on computer simulations indicating a rate of fracture fluid flowback from the reservoir 18.

Figure 1B:
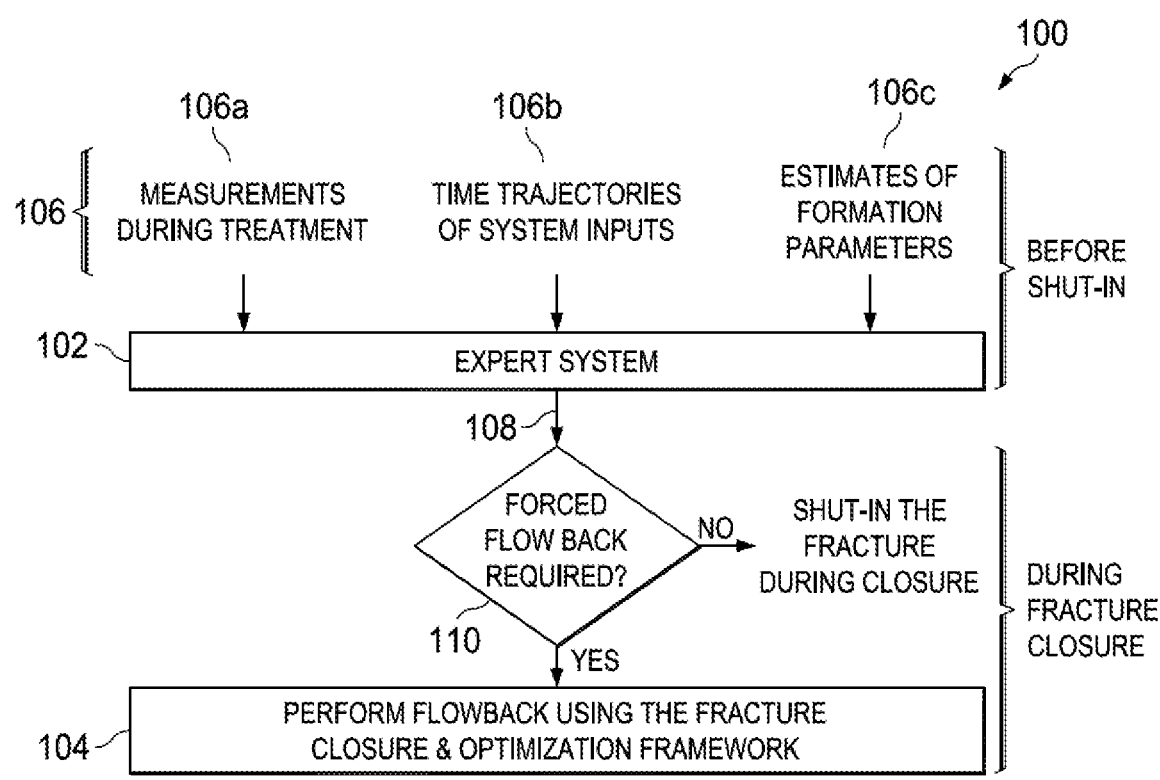
FIG. 1B is a block diagram of a structure of a fluid flowback control method, according to certain embodiments of the present disclosure.

FIG. 1B is a block diagram of a structure 100 of a fluid flowback control method, according to certain embodiments of the present disclosure. As illustrated in FIG. 1B, the structure 100 of the fluid flowback control may comprise two main subsystems, an expert system 102 and a flowback control framework 104. The expert system 102 may be configured to evaluate (e.g., before fracture shut-in) the necessity of performing fluid flowback based upon one or more inputs 106. Such inputs 106 may be information collected before and during a treatment stage of a current hydraulic fracturing operation. In one or more embodiments, the inputs 106 may be related to formation information gained prior to the current treatment stage. In one or more other embodiments, the inputs 106 may comprise measurement information 106a obtained during the fracture treatment. For example, the measurement information 106a may be obtained by one or more sensors located in a wellbore (such as sensors 25 located in wellbore 24 in FIG. 1A). Likewise, such inputs 106 may be time trajectories of system inputs 106b during the fracture treatment. For example, the time trajectories of system inputs 106b may be information about changes of a fluid flow rate over time during the fracture treatment (e.g., obtained by flowmeters or sensors 25 at wellhead 21 of well fracturing system 10 in FIG. 1A and/or by pump sensors 25 coupled to pump trucks 22 in FIG. 1A), and/or information about changes over time during the fracture treatment in concentration of proppant added to a treatment fluid. Finally, inputs 106 may be related to formation parameters, such as formation information (measured and/or estimated) 106c, which may be estimated, in some embodiments, based on measurement information 106a received from one or more sensors (such as sensors 25 in FIG. 1A) deployed in a well fracturing system that is the subject of proposed or active hydraulic fracturing operations.

In one or more embodiments, an output 108 of the expert system 102 may comprise a decision, as discussed in more detail below, about the necessity of performing fluid flowback during a fracture closure stage following the fracture injection or treatment stage. If, based on the expert system output 108, the fluid flowback is not required (e.g., determined at a decision block 110), the fracture may be shut-in during the fracture closure stage. In the case when the fluid flowback is warranted based on the expert system output 108, optimization of a fluid flowback rate may be initiated through the framework 104. Such optimization may be carried out at a discreet point in time, such as prior to the fracture closure stage, or may be carried out continuously in real-time and used to control flowback throughout the fracture closure stage of the hydraulic fracturing operation.

Figure 2:
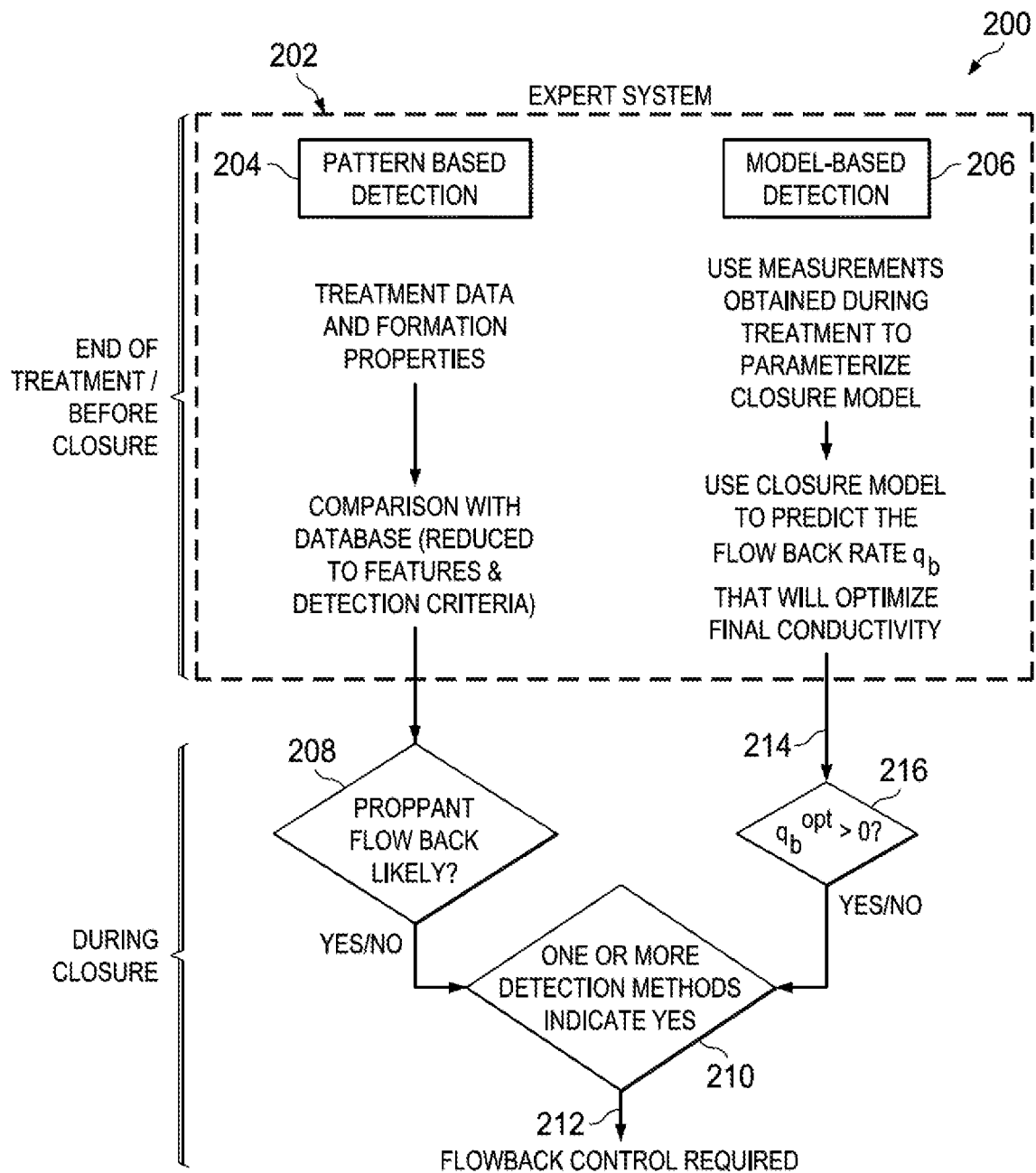
FIG. 2 is a block diagram of an expert system for fluid flowback control decision making, according to certain embodiments of the present disclosure.

FIG. 2 is a block diagram 200 of an expert system for fluid flowback control decision making, according to certain embodiments of the present disclosure. As illustrated in FIG. 2, an expert system 202 (e.g., which may correspond to the expert system 102 from FIG. 1B) may utilize, separately or in parallel, two different methods for detecting the necessity of fluid flowback control during a fracture closure stage of a current fracturing operation, namely a pattern-recognition-based detection method 204 and a model-based detection method 206. In one or more embodiments, the pattern-recognition-based detection method 204 may determine whether the fluid flowback control is required based upon similarities of features and/or measured behavior data of a current (or proposed) well fracturing system (such as system 10 in FIG. 1A) compared to a historical database of features and/or measured data from well fracturing systems of completed or past fracturing operations, and whether, proppant bank degradation occurred in the completed fracturing operations. Such well fracturing system data may relate to a formation itself, equipment utilized (or proposed to be utilized, as the case may be) in a fracturing operation, information related to any of the forgoing obtained by sensors and the response of any of the foregoing. For example, the pattern-recognition-based detection 204 may determine that proppant degradation occurred in completed jobs having historical data that is similar to a pattern of features and measured behavior of the current job. In such case, proppant degradation is deemed likely to occur (e.g., established at a decision block 208), and the expert system 202 and the pattern-recognition-based detection 204 may output (e.g., through a decision block 210) a decision 212 to initiate real-time control of a fluid flowback rate during the fracture closure stage of the fracturing operation.

As further illustrated in FIG. 2, the model-based detection method 206 of the expert system 202 may be operated separately or in parallel with the pattern-recognition-based detection method 204 to determine whether fluid flowback during fracture closure should be implemented. In one or more embodiments, the model-based detection method 206 may be carried out by (1) creating or updating a model of a predicted fracture system behavior (i.e., a fracture closure model) through the use of measurements obtained during a treatment stage preceding fracture closure in order to select an appropriate closure model structure and estimate model parameters and states; and (2) using, within an optimization program, the closure model along with a user-selected objective (e.g., related to a final condition of a closed fracture) to select a fluid flowback rate 214 (the fluid flowback rate $q_b$) that optimizes the user-selected objective. If the predicted optimal fluid flowback rate $q_b^{opt}$ is greater than zero (e.g., determined at a decision block 216), then the expert system 202 and the model-based detection 206 may output (e.g., through the decision block 210) decision 212 to initiate real-time control of the fluid flowback rate during the fracture closure stage. In other embodiments, if the pattern-recognition-based detection 204 determines that proppant degradation is unlikely and the model-based detection 206 determines that a fluid flowback rate of zero (i.e., no flowback) is optimal, then the expert system 202 may decide not to perform real-time control of the fluid flowback rate during the fracture closure. In yet other embodiments, if the pattern-recognition-based detection 204 determines that proppant degradation is likely and the model-based detection 206 determines that the fluid flowback rate of zero is optimal (i.e., the pattern-recognition-based detection 204 and the model-based detection 206 do not agree on the necessity to perform fluid flowback), the expert system 202 may still initiate real-time control of the fluid flowback rate during the fracture closure stage. Similarly, if the pattern-recognition-based detection 204 determines that proppant degradation is unlikely and the model-based detection 206 determines that the fluid flowback rate greater than zero is optimal, the expert system 202 may also initiate real-time control of the fluid flowback rate during the fracture closure stage.

For some embodiments of the present disclosure, two types of classification methods can be used for the pattern-recognition-based detection method 204: supervised learning and unsupervised learning. In one or more embodiments, the supervised learning classification method may be used as the pattern-recognition-based method to predict, based on historical data from completed fracturing operations, whether fluid flowback would prevent proppant degradation. Hence, a classifier created according to the supervised learning classification method may place the current fracturing system into one of two possible classes, i.e., the "fluid flowback recommended" class and the "fluid flowback not recommended" class.

Figure 3:
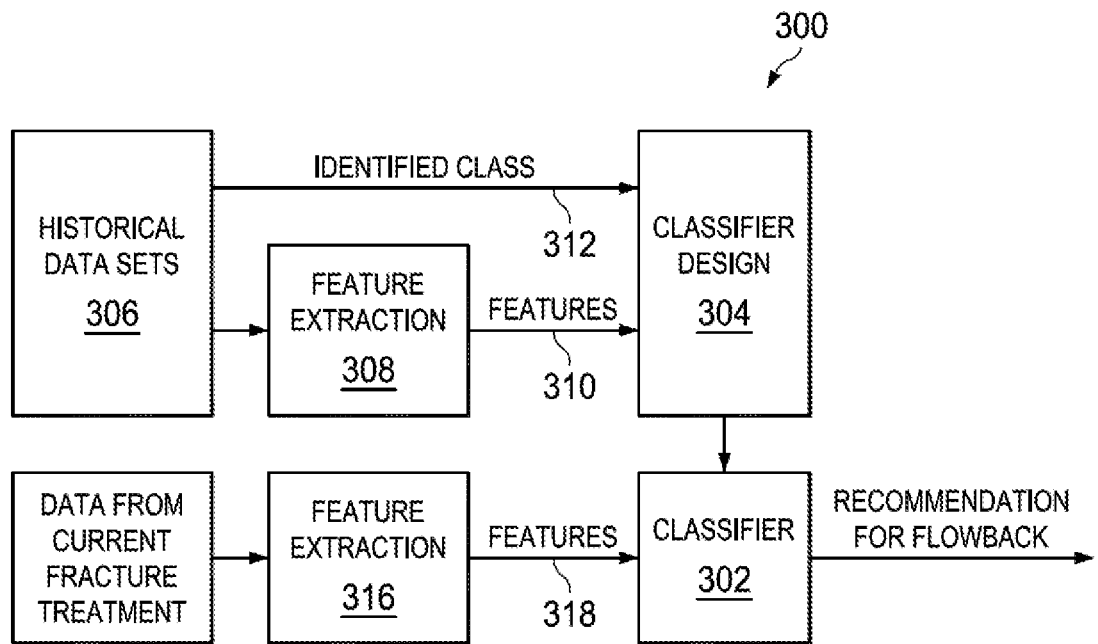
FIG. 3 is a block diagram of a pattern-recognition-based fluid flowback control necessity detection method, according to certain embodiments of the present disclosure.

FIG. 3 is a block diagram 300 of a pattern-based fluid flowback control necessity detection method based on the supervised learning classification, according to certain embodiments of the present disclosure. For example, the pattern-based fluid flowback control method illustrated in FIG. 3 may correspond to the pattern-recognition-based detection method 204 of the expert system 200 illustrated in FIG. 2. Before classification of the current fracturing system is attempted, a classifier 302 may be created (e.g., within a classifier design block 304), according to a particular supervised learning classification method chosen. In one or more embodiments, the classifier 302 may be designed (e.g., within the classifier design block 304) based on training data, which may be historical data sets 306 collected from completed fracturing jobs. The training data (e.g., the historical data sets 306) may be reduced (e.g., within a feature extraction block 308) into a set of features 310, which may represent basic units that pattern classification techniques operate upon. A feature can be any quality that can be used to describe a member of a data set being classified. For example, features can include measured quantities, model parameters, and/or choices made during a fracturing operation.

For data from a completed fracturing job to be useful as training data, classification of that completed fracturing job may need to be known. There are two possible classes, i.e., the "fluid flowback recommended" class and the "fluid flowback not recommended" class. In one or more embodiments, the class may be chosen based on an opinion of an expert familiar with one or more fracturing jobs utilized as part of the evaluation set. In these historical fracturing jobs, fluid flowback may or may not have been conducted. For example, if the fluid flowback was not conducted and a well was shut-in for fracture closure, the recommendation of whether or not fluid flowback should have occurred can be made with the benefit of hindsight based on whether proppant crushing and/or proppant flowback were observed during cleanup and/or production. On the other hand, if fluid flowback was implemented in the historical fracturing jobs in the evaluation set, the posterior recommendation may be based on an expert opinion of whether or not fluid flowback significantly aided in prevention of proppant degradation.

For each set of historical data describing a particular fracturing operation, if the recommendation on fluid flowback can be determined (e.g., either "fluid flowback recommended" or "fluid flowback not recommended"), this historical data can be added to the set of classifier training data 306. Then, the features 310 and an identified class 312 may be extracted from this training data 306, and utilized by the classifier design block 304 in creating the classifier 302.

Two different types of feature sources are presented in this disclosure, i.e., direct feature sources and indirect feature sources. In one or more embodiments, direct feature sources may comprise formation parameters, such as Young's modulus, shear modulus, leak-off coefficient, porosity and permeability. In one or more embodiments, indirect feature sources (i.e., feature sources obtained indirectly through various measurements) may comprise records over time (time trajectories) of different variables that can be manipulated, and measurements related to a fracturing system. Time trajectories of manipulated variables refer to records of system inputs, which may include, without limitation, records of fluid injection rates, records of fluid flow pressures, records of fluid volumes, records of fluid densities, or records of proppant concentrations in treatment fluids. Fracturing system measurements may include, without limitation, downhole pressures or micro-seismic data. With a proper measurement filter structure, the fracture length growth pattern over time may be estimated from the micro seismic events.

In one or more embodiments, the indirect feature extraction may comprise identification of one or more models to describe at least one of the following: time-dependent manipulated variable, state estimate, or measurement trajectories. For example, in an embodiment of measurement trajectories, the concentration of proppant added to a treatment fluid pumped downhole may be described by the model:

$$C(t) = a_1 \left( \frac{t - \tau_1}{t_{end} - \tau_1} \right)^{a_2}, \tag{1}$$

where $a_1$ and $a_2$ are trajectory parameters or features that describe the time trajectory of proppant concentration, $\tau_1$ is a time instant when a treatment stage starts, and $t_{end}$ is a time instant when the treatment stage ends. In other embodiments, a fitting polynomial model or time series models between different available time trajectories may be implemented, wherein the model parameters may be used as features. For example, the AutoRegressive-Moving-Average model with eXogenous inputs (i.e., ARMAX type model) may describe relation between a fracture length $L_t$ and an injection rate $q_t$ at a given time instant t such as:

$$L_t = \gamma_1 q_{t-1} + \ldots + \gamma_n q_{t-n} + \delta_1 L_{t-1} + \ldots + \delta_m L_{t-m} + ce_t, \quad (2)$$

where $\gamma_i$ (i=1, . . . , n) and $\delta_j$ (j=1, . . . , m) are model parameters, c is a constant coefficient and $e_t$ is a white noise. The ARMAX type model may be used to generate features from the model parameters $\gamma_i$ (i=1, . . . , n), $\delta_j$ (j=1, . . . , m) and the constant coefficient c.

Following feature extraction and dimension reduction of historical data, the next operation is designing classifier 302 (e.g., within the classifier design block 304). In one or more embodiments, classifier 302 may be designed using, for example, the support vector machine (SVM) method. The SVM-based classifier 302 may be trained to provide a level of performance based on a set of feature data extracted from the historical database 306. Given the other features, the SVM-based classifier 302 may be able to predict whether or not fluid flowback was recommended in each case. In embodiments, training of the classifier 302 may be carried out offline, e.g., long before a current fracturing job. After design of the classifier 302 is finalized, the classifier 302 may be used on subsequent fracturing operations at the end of the treatment stage. As illustrated in FIG. 3, data 314 from a current fracture treatment may be reduced, within a feature extraction block 316, into a set of features 318 describing the current fracture treatment and the fracture system behavior. Then, the classifier 302 may be executed using the set of features 318 to determine whether the current fracturing system belongs to the "fluid flowback recommended" class or the "fluid flowback not recommended" class.

Figure 4:
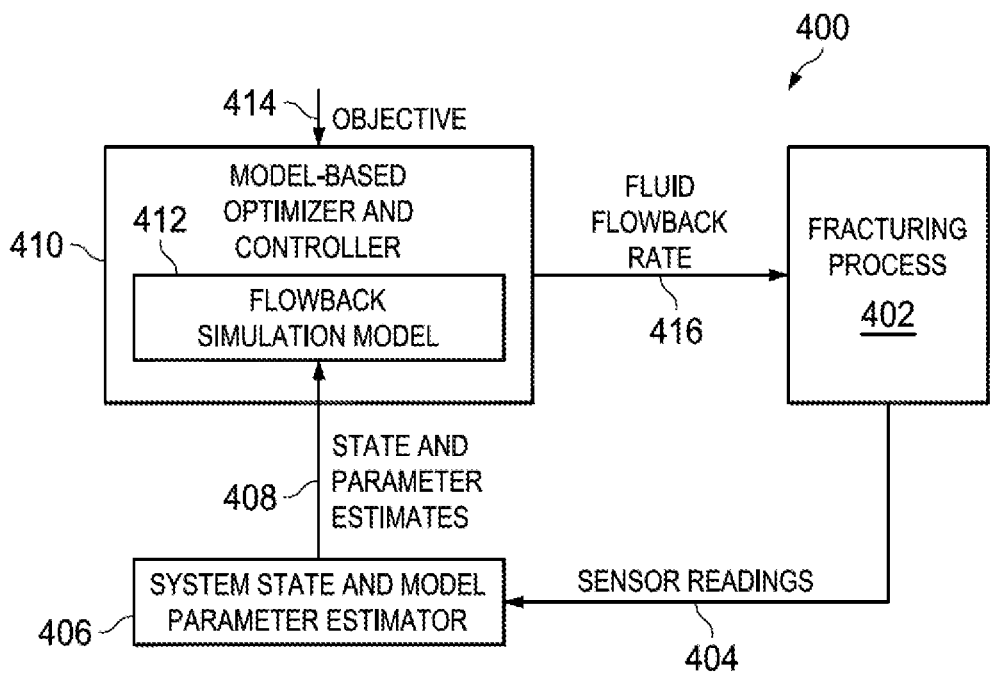
FIG. 4 is a block diagram of a model-based fluid flowback control necessity detection method, according to certain embodiments of the present disclosure.

FIG. 4 is a block diagram of a fluid flowback control framework 400 configured in accordance with the model-based detection method 206 of the expert system 200 illustrated in FIG. 2, according to certain embodiments of the present disclosure. As discussed, the model-based detection 206 may be applied to evaluate the necessity of implementing fluid flowback (as opposed to shutting in the wellbore during a fracture closure stage of a hydraulic fracturing operation) from the model-simulation point of view. In one or more embodiments, a model of a predicted fracture system behavior (i.e., the fracture closure model) may include the ability to predict the behavior of fracture fluid flow, the fracture geometry, and/or the proppant transport during fracturing closure. In order to achieve a better prediction of fracture system behavior, parameters of the fracture closure model (e.g., a leak-off coefficient, formation properties, and the like) may be estimated during fracture treatment using measurements received during the fracture treatment stage of a fracturing operation. The parameterized fracture closure model may be then utilized to predict a fluid flowback rate that would optimize a final conductivity of a fracture. If the predicted optimal fluid flowback rate is greater than zero, then the model-based fluid flowback control may be initiated during the fracture closure stage of the fracturing operation.

The flowchart 400 illustrated in FIG. 4 shows one potential implementation of the model-based control framework. A hydraulic fracturing system, such as injection system 14 shown in FIG. 1A, under control may comprise the following components: fracturing process 402, which may involve a surface equipment, such as pump truck 22 shown in FIG. 1A and any related hoses, tubes, fluid tanks or reservoirs, blenders, pumps, valves, the well and fracture, and sensors, such as sensors 25 shown in FIG. 1A, for measuring the fracturing process; measurements (sensor readings) 404 produced during the fracturing process 402 by the sensors that may be recorded digitally; a module 406 for system state and model parameter estimation that may be implemented on a computer system; state and parameter estimates 408 produced by the estimator 406; a model-based optimizer and controller 410 (e.g., implemented by software on the computer system); a flowback simulation model 412 (e.g., integrated within the model-based optimizer and controller 410) used to predict future behavior of the fracturing system (e.g., implemented on the computer system). Furthermore, a component 414 of the model-based control framework 400 may comprise a user-defined objective, which may be provided to the optimizer and controller 410. For example, the user-defined objective 414 may be to minimize a predicted amount of proppant that will be either crushed, settled, or lost to a wellbore during fracture closure. As illustrated in FIG. 4, an output 416 of the optimizer and controller 410 may be a desired (optimized) rate of fluid flowback from the fracture to the wellbore.

In one or more embodiments, the measurements (e.g., sensor readings) 404 from the fracturing process 402 may be fed into the system state and model parameter estimator module 406. For example, the measurements 404 may include at least one of a proppant concentration of a treatment fluid flowed back to a surface, a wellbore pressure, or injection rates, concentrations or pressures. In an embodiment, after being fed to the estimator module 406, the measurements 404 may be also filtered to remove the effects of noise. Then, the filtered measurements 404 may be mutually combined (e.g., within the estimator module 406) and used to estimate other unmeasured system states 408. In one or more embodiments, the state estimation technique implemented within the estimator module 406 may be based on particle filtering. For example, the particle filtering may utilize a nonlinear system model to produce an ensemble of state estimates 408, calculate a weight associated with each state estimate within the ensemble based on its possibility to generate each received measurement, and then compute a preferred state estimate based on the weighted ensemble of state estimates.

In one or more embodiments, model parameters 408 may be estimated by the estimator module 406 (e.g., simultaneously with the state estimation) using the same particle filtering mechanism. Over time, adaptation of the estimated model parameters 408 may lead to a better ability of the model to predict the future response of the fracturing system to changes in a fluid flowback rate. In an embodiment, the update of system state and model parameter estimates 408 may be conducted at the same temporal speed as refreshment of the measurements 404 associated with the fracturing process 402. The updated system state and model parameter estimates 408 may be then used inside the optimizer and controller 410 to predict future system behavior over a predefined time horizon. The optimizer and controller 410 may then compute a preferred sequence of changes in the fluid flowback rate that would optimize the objective function 414. The first computed change in the fluid flowback rate then may be implemented by the fracturing system. In one or more embodiments, the operations may be repeated at subsequent controller time steps.

Figure 5:
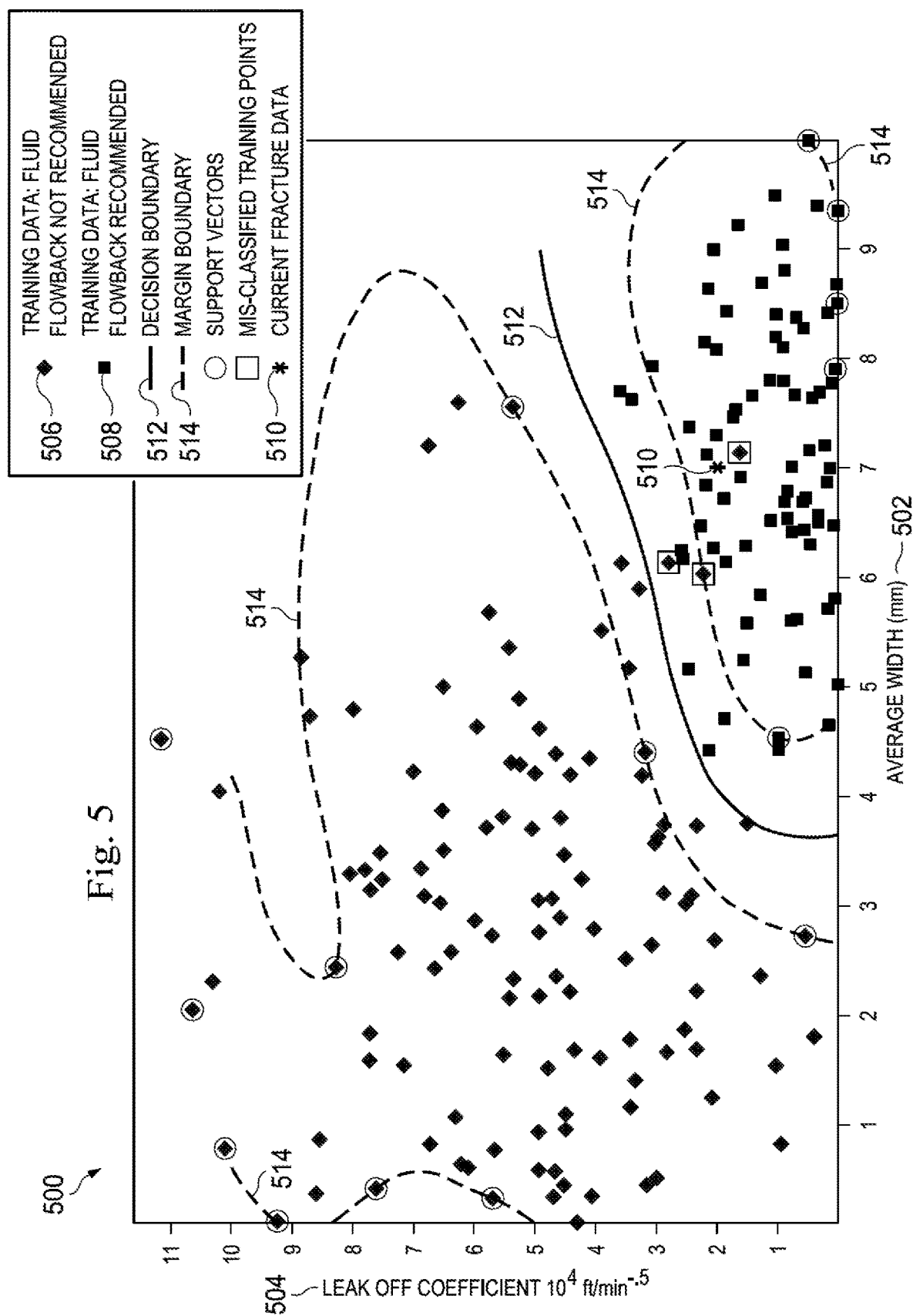
FIG. 5 is a graph of an example pattern classification on a fluid leak-off rate and an average fracture width, according to certain embodiments of the present disclosure.

FIG. 5 is a graph 500 of an example pattern classification on a fluid leak-off rate and an average fracture width, according to certain embodiments of the present disclosure. The pattern classification illustrated in FIG. 5 may be in accordance with the pattern-recognition-based detection method based on supervised learning classification illustrated in FIG. 3. In the example illustrated in FIG. 5, the Kernel SVM method is chosen to generate a nonlinear classifier (e.g., the classifier 302 of the pattern-based fluid flowback control framework illustrated in FIG. 3). An average fracture width 502 and a leak-off coefficient (rate) 504 represent two features taken from a set of historical data (e.g., the historical data 306 in FIG. 3), and used to train the classifier (e.g., the classifier 302 in FIG. 3). As illustrated in FIG. 5, training data can be divided into two groups: training data 506 belonging to a class "fluid flowback not recommended" and training data 508 belonging to another class "fluid flowback recommended". The nonlinear classifier (e.g., the classifier 302 in FIG. 3) created from the training data 506 and 508 can be used to determine whether data 510 from a current fracture job belongs to the class "fluid flowback recommended" or to the other class "fluid flowback not recommended" based upon its estimated average fracture width 502 and leak-off coefficient 504. The determination of class to which the current fracture data 510 belongs may be based on which side of a classification (decision) boundary 512 the data point 510 from the current fracture is located. In the example data illustrated in FIG. 5, the current fracture data 510 is classified as the class "fluid flowback recommended".

Due to the nature of the formation effect on the classifier (e.g., the classifier 302 in FIG. 3), a reclassification may be applied from one field to another, or from one zone to another. As data are used for fluid flowback control, the reclassification may be further automatically integrated into the classifier training with known post job performance metrics. If there is a consistent error in the classification model, depending on the severity, the classifier may be scraped and relearned with the local field training data. When this relearning is in process, a margin boundary (e.g., margin boundaries 514 illustrated in FIG. 5) may become the feedback term for an operator to understand the quality of the classifier model. For example, once the margin boundary (e.g., the margin boundaries 514) drops below a specified level indicating the model distribution has a decreased standard deviation, the margin boundary can again be used to control the flowback system.

Figure 6:
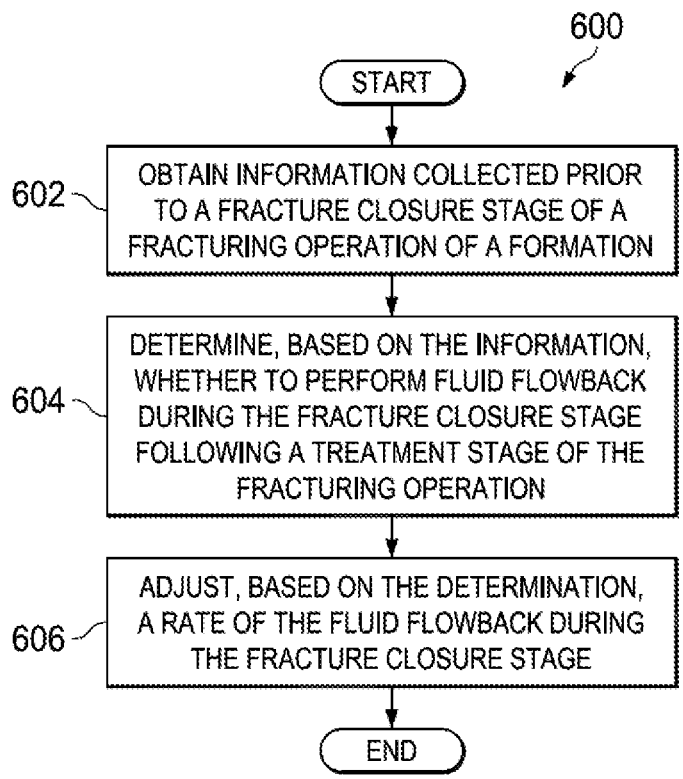
FIG. 6 is a flow chart of a method for the fluid flowback control and optimization, according to certain embodiments of the present disclosure.

Discussion of an illustrative method of the present disclosure will now be made with reference to FIG. 6, which is a flow chart 600 of a method for performing fluid flowback control and optimization, according to certain embodiments of the present disclosure. The method begins at 602 by obtaining information collected prior to a fracture closure stage of a fracturing operation of a reservoir formation. At 604, based on the collected information, it may be determined (e.g., by the expert system 102 in FIG. 1B and/or the expert system 202 in FIG. 2 by employing the pattern-recognition-based detection method 204 and/or the model-based detection method 206) whether to perform fluid flowback during the fracture closure stage following a treatment stage of the fracturing operation. At 606, based on the determination, a rate of the fluid flowback may be adjusted (and optimized) during the fracture closure stage.

Figure 7:
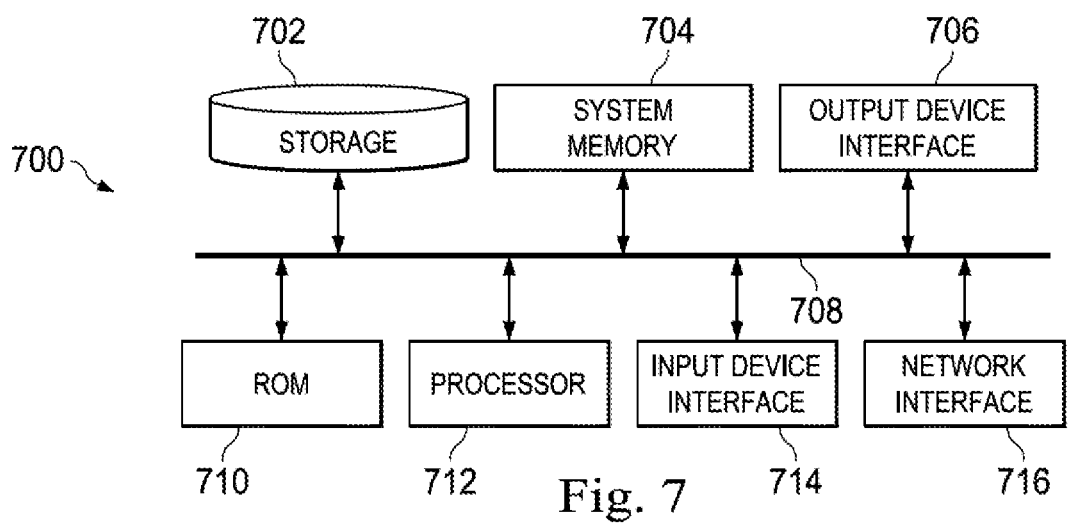
FIG. 7 is a block diagram of an illustrative computer system in which embodiments of the present disclosure may be implemented.

FIG. 7 is a block diagram of an illustrative computing system 700 (also illustrated in FIG. 1A as computing system 32) in which embodiments of the present disclosure may be implemented adapted for implementing the fluid flowback control in hydraulic fracturing. For example, the operations of frameworks 100, 200, 300 and 400 from FIGS. 1B-4 and the operations of method 600 of FIG. 6, as described above, may be implemented using the computing system 700. The computing system 700 can be a computer, phone, personal digital assistant (PDA), or any other type of electronic device. Such an electronic device includes various types of computer readable media and interfaces for various other types of computer readable media. As shown in FIG. 7, the computing system 700 includes a permanent storage device 702, a system memory 704, an output device interface 706, a system communications bus 708, a read-only memory (ROM) 710, processing unit(s) 712, an input device interface 714, and a network interface 716.

The bus 708 collectively represents all system, peripheral, and chipset buses that communicatively connect the numerous internal devices of the computing system 700. For instance, the bus 708 communicatively connects the processing unit(s) 712 with the ROM 710, the system memory 704, and the permanent storage device 702.

From these various memory units, the processing unit(s) 712 retrieves instructions to execute and data to process in order to execute the processes of the subject disclosure. The processing unit(s) can be a single processor or a multi-core processor in different implementations.

The ROM 710 stores static data and instructions that are needed by the processing unit(s) 712 and other modules of the computing system 700. The permanent storage device 702, on the other hand, is a read-and-write memory device. This device is a non-volatile memory unit that stores instructions and data even when the computing system 700 is off. Some implementations of the subject disclosure use a mass-storage device (such as a magnetic or optical disk and its corresponding disk drive) as the permanent storage device 702.

Other implementations use a removable storage device (such as a floppy disk, flash drive, and its corresponding disk drive) as the permanent storage device 702. Like the permanent storage device 702, the system memory 704 is a read-and-write memory device. However, unlike the storage device 702, the system memory 704 is a volatile read-and-write memory, such a random access memory. The system memory 704 stores some of the instructions and data that the processor needs at runtime. In some implementations, the processes of the subject disclosure are stored in the system memory 704, the permanent storage device 702, and/or the ROM 710. For example, the various memory units include instructions for computer aided pipe string design based on existing string designs in accordance with some implementations. From these various memory units, the processing unit(s) 712 retrieves instructions to execute and data to process in order to execute the processes of some implementations.

The bus 708 also connects to the input and output device interfaces 714 and 706. The input device interface 714 enables the user to communicate information and select commands to the computing system 700. Input devices used with the input device interface 714 include, for example, alphanumeric, QWERTY, or T9 keyboards, microphones, and pointing devices (also called "cursor control devices"). The output device interfaces 706 enables, for example, the display of images generated by the computing system 700. Output devices used with the output device interface 706 include, for example, printers and display devices, such as cathode ray tubes (CRT) or liquid crystal displays (LCD). Some implementations include devices such as a touchscreen that functions as both input and output devices. It should be appreciated that embodiments of the present disclosure may be implemented using a computer including any of various types of input and output devices for enabling interaction with a user. Such interaction may include feedback to or from the user in different forms of sensory feedback including, but not limited to, visual feedback, auditory feedback, or tactile feedback. Further, input from the user can be received in any form including, but not limited to, acoustic, speech, or tactile input. Additionally, interaction with the user may include transmitting and receiving different types of information, e.g., in the form of documents, to and from the user via the above-described interfaces.

Also, as shown in FIG. 7, the bus 708 also couples the computing system 700 to a public or private network (not shown) or combination of networks through a network interface 716. Such a network may include, for example, a local area network ("LAN"), such as an Intranet, or a wide area network ("WAN"), such as the Internet. Any or all components of the computing system 700 can be used in conjunction with the subject disclosure.

These functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself. Accordingly, the operations of frameworks 100, 200, 300 and 400 from FIGS. 1B-4 and the operations of method 600 of FIG. 6, as described above, may be implemented using the computing system 700 or any computer system having processing circuitry or a computer program product including instructions stored therein, which, when executed by at least one processor, causes the processor to perform functions relating to these methods.

As used in this specification and any claims of this application, the terms "computer", "server", "processor", and "memory" all refer to electronic or other technological devices. These terms exclude people or groups of people. As used herein, the terms "computer readable medium" and "computer readable media" refer generally to tangible, physical, and non-transitory electronic storage mediums that store information in a form that is readable by a computer.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs implemented on the respective computers and having a client-server relationship to each other. In some embodiments, a server transmits data (e.g., a web page) to a client device (e.g., for purposes of displaying data to and receiving user input from a user interacting with the client device). Data generated at the client device (e.g., a result of the user interaction) can be received from the client device at the server.

It is understood that any specific order or hierarchy of operations in the processes disclosed is an illustration of exemplary approaches. Based upon design preferences, it is understood that the specific order or hierarchy of operations in the processes may be rearranged, or that all illustrated operations be performed. Some of the operations may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Furthermore, the illustrative methods described herein may be implemented by a system including processing circuitry or a computer program product including instructions which, when executed by at least one processor, causes the processor to perform any of the methods described herein.

Referring back to FIG. 1A, computing system 32, such as computing system 700 illustrated in FIG. 7, may be adapted for implementing fluid flowback control decision making and optimization as described in the present disclosure. For example, during a hydraulic fracturing procedure, computing system 700 may be configured to determine whether or not flowback of fracturing fluid 16 during a fracture closure stage is desirable. If fluid flowback is desired, the optimization and control framework presented herein may be implemented by computing system 700 to determine an optimal fluid flowback rate based on a particular set of parameters. In one or more embodiments, adjustments to the fluid flowback rate may be determined by computing system 700 in real-time and implemented by injection system 14 during the fracture closure stage to take advantage of updated system measurements obtained during the fracturing operation. Furthermore, computing system 700 may operate a fluid flow control module of the working string 26, which may be configured to control the fluid flowback during fracture closure as described in the present disclosure.

Preventing proppant degradation during and after fracture closure in the conventional manner is limited to physics-based methods with a goal to either change the proppant property or the fluid properties. The present disclosure differs from the conventional approach by optimizing operational parameters of the hydraulic fracturing procedure in order to minimize proppant degradation. Advantages of the present disclosure include, but are not limited to, dynamical real-time control of fluid flowback during fracture closure, thus delivering improved performance of the hydraulic fracturing operation, and optimization of user-defined objectives.

A computer-implemented method for performing fluid flowback control has been described in the present disclosure and may generally include: obtaining information collected prior to a fracture closure stage of a fracturing operation of a formation; determining, based on the information, whether to perform fluid flowback during the fracture closure stage following a treatment stage of the fracturing operation; and adjusting, based on the determination, a rate of the fluid flowback during the fracture closure stage. Further, a computer-readable storage medium with instructions stored therein has been described, instructions when executed by a computer cause the computer to perform a plurality of functions, including functions to: obtain information collected prior to a fracture closure stage of a fracturing operation of a formation; determine, based on the information, whether to perform fluid flowback during the fracture closure stage following a treatment stage of the fracturing operation; and adjust, based on the determination, a rate of the fluid flowback during the fracture closure stage. Further, a method for performing a hydraulic fracturing operation has been described in the present disclosure and may generally include: initiating injection of a fracturing fluid into a formation via a wellbore in a treatment stage of a fracturing operation utilizing a pump truck; prior to a fracture closure stage of the fracturing operation following the treatment stage, determining whether conditions exist in a well fracturing system for implementation of fluid flowback procedures; upon a determination that fluid flowback procedures should be implemented in a well fracturing operation, determining an optimized flowback rate for the well fracturing system based on a predetermined objective; and operating the well fracturing system to achieve the optimized flowback rate.

For the foregoing embodiments, the method or functions may include any one of the following operations, alone or in combination with each other: Selecting the information from the group consisting of formation information gained prior to the treatment stage, time trajectories of system inputs during the treatment stage, measurements obtained during the treatment stage, and system parameters estimated based on the measurements; The determination comprises at least one of a pattern-recognition-based determination, or a model-based determination; Obtaining a first set of well fracturing system data of at least one of features and measured behavior of a well fracturing system for which the fracturing operation is initiated; Comparing the first set of data with a second set of well fracturing system data of completed fracturing operations or with a classification rule resulting from the second set of well fracturing system data; initiating, based on the comparison, the adjustment of the rate of the fluid flowback during the fracture closure stage; Applying supervised learning classification to predict, based on the second set of data, whether the fluid flowback prevents proppant degradation associated with the fracturing operation; Creating a model of a predicted well fracturing system behavior based on measurements obtained during the treatment stage of the fracturing operation of the formation; Using the model of the predicted well fracturing system behavior and a user-defined objective to select the rate of the fluid flowback that optimizes the user-defined objective; Initiating the adjustment of the rate of the fluid flowback during the fracture closure stage, if the selected rate of the fluid flowback is greater than zero; Adding, to a set of classifier training data, feature data extracted from a historical database related to completed fracturing operations; Extracting features from the set of classifier training data; Training a classifier to predict whether to perform the fluid flowback during the fracture closure stage, based on the extracted features and identified classes related to the feature data, the identified classes comprise recommendation for fluid flowback associated with the completed fracturing operations; Executing the classifier using a set of features describing the treatment stage of the fracturing operation to determine whether to perform the fluid flowback during the fracture closure stage; Identifying one or more models describing the at least one of the formation parameters, the manipulated variables, or the fracturing system measurements; Obtaining measurements from the initiated fracturing operation; Filtering the measurements to remove a noise; Estimating and updating unmeasured system states and model parameters based on the filtered measurements; Determining, based on the updated system states and model parameters, a sequence of changes in the rate of the fluid flowback over a predefined time period that optimize a user-defined objective; Utilizing the pump truck to control the rate of flowback from the wellbore.

The features comprise at least one of: one or more formation parameters, time trajectories of manipulated variables, or fracturing system measurements; One or more formation parameters comprise at least one of a Young's modulus, a shear modulus, a leak-off coefficient, a porosity, or a permeability; The time trajectories of manipulated variables are related to records of system inputs comprising at least one of a fluid injection rate or a proppant degradation; The fracturing system measurements comprise at least one of a downhole pressure or micro seismic data with information about a fracture length growth pattern over time; The user-defined objective comprises minimizing a predicted amount of proppant degradation during the fracture closure stage of the fracturing operation; The second set of data comprises information about proppant degradation related to the completed fracturing operations; The user-defined objective is related to a final condition of a fracture system after the fracture closure stage of the fracturing operation.

Likewise, a system for performing fluid flowback control has been described and include at least one processor and a memory coupled to the processor having instructions stored therein, which when executed by the processor, cause the processor to perform functions, including functions to: obtain information collected prior to a fracture closure stage of a fracturing operation of a formation; determine, based on the information, whether to perform fluid flowback during the closure stage following a treatment stage of the fracturing operation; and adjust, based on the determination, a rate of the fluid flowback during the fracture closure stage. Further, a system for performing a hydraulic fracturing operation has been described and may generally include a pump truck; a fluid source; a proppant source; at least one sensor disposed to measure a condition of a well fracturing system; and a computer system with a software having instructions, the instructions when executed by the computer system cause the computer system to perform a plurality of functions, including functions to: initiate injection of a fracturing fluid from the fluid source into a formation via a wellbore in a treatment stage of a fracturing operation utilizing the pump truck, the fracturing fluid comprises a proppant from the proppant source; prior to a fracture closure stage of the fracturing operation following the treatment stage, determine, based on one or more measurements of the at least one sensor, whether the condition of the well fracturing system is for implementation of fluid flowback procedures; upon a determination that the fluid flowback procedures should be implemented in the hydraulic fracturing operation, determine an optimized flowback rate for the well fracturing system based on a predetermined objective; and generate an order to operate the well fracturing system to achieve the optimized flowback rate; the pump truck is further utilized to control the rate of flowback from the wellbore.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

While specific details about the above embodiments have been described, the above hardware and software descriptions are intended merely as example embodiments and are not intended to limit the structure or implementation of the disclosed embodiments. For instance, although many other internal components of computer system 700 are not shown, those of ordinary skill in the art will appreciate that such components and their interconnection are well known.

In addition, certain aspects of the disclosed embodiments, as outlined above, may be embodied in software that is executed using one or more processing units/components. Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives, optical or magnetic disks, and the like, which may provide storage at any time for the software programming.

Additionally, the flowchart and block diagrams in the figures illustrate the architecture, functionality, and operation of possible implementations of systems, methods and computer program products according to various embodiments of the present disclosure. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The above specific example embodiments are not intended to limit the scope of the claims. The example embodiments may be modified by including, excluding, or combining one or more features or functions described in the disclosure.

What is claimed is:

1. A computer-implemented method for performing fluid flowback control, the method comprising:
    obtaining information collected prior to a fracture closure stage of a fracturing operation of a formation;
    determining, based on the information, whether to perform fluid flowback during the fracture closure stage following a treatment stage of the fracturing operation; and
    adjusting, based on the determination to perform fluid flowback, a rate of the fluid flowback during the fracture closure stage,
    wherein learning classification is applied to predict whether the fluid flowback prevents proppant degradation associated with the fracturing operation.

2. The method of claim 1, wherein:
    the information is selected from the group consisting of formation information gained prior to the treatment stage, time trajectories of system inputs during the treatment stage, measurements obtained during the treatment stage, and system parameters estimated based on the measurements; or
    the determination comprises at least one of a pattern-recognition-based determination, or a model-based determination.

3. The method of claim 2, wherein the determination comprises a pattern-recognition-based determination, wherein the pattern-recognition-based determination comprises:
    obtaining a first set of well fracturing system data of at least one of features and measured behavior of a well fracturing system for which the fracturing operation is initiated;
    comparing the first set of data with a second set of well fracturing system data of completed fracturing operations or with a classification rule resulting from the second set of well fracturing system data; and
    initiating, based on the comparison, the adjustment of the rate of the fluid flowback during the fracture closure stage.

4. The method of claim 3, wherein the comparison comprises:
    applying supervised learning classification to predict, based on the second set of data, whether the fluid flowback prevents proppant degradation associated with the fracturing operation.

5. The method of claim 2, wherein the determination comprises a model-based determination, wherein the model-based determination comprises:
    creating a model of a predicted well fracturing system behavior based on measurements obtained during the treatment stage of the fracturing operation of the formation; and using the model of the predicted well fracturing system behavior and a user-defined objective to select the rate of the fluid flowback that optimizes the user-defined objective.

6. The method of claim 5, further comprising:
initiating the adjustment of the rate of the fluid flowback during the fracture closure stage, if the selected rate of the fluid flowback is greater than zero.

7. The method of claim 2, wherein the determination comprises a pattern-recognition-based determination, wherein the pattern-recognition-based determination based on learning classification comprises:
adding, to a set of classifier training data, feature data extracted from a historical database related to completed fracturing operations;
extracting features from the set of classifier training data;
training a classifier to predict whether to perform the fluid flowback during the fracture closure stage, based on the extracted features and identified classes related to the feature data, the identified classes comprise recommendation for fluid flowback associated with the completed fracturing operations; and
executing the classifier using a set of features describing the treatment stage of the fracturing operation to determine whether to perform the fluid flowback during the fracture closure stage.

8. The method of claim 2, wherein the determination comprises a model-based determination, wherein the model-based determination comprises:
obtaining measurements from the initiated fracturing operation;
filtering the measurements to remove a noise;
estimating and updating unmeasured system states and model parameters based on the filtered measurements; and
determining, based on the updated system states and model parameters, a sequence of changes in the rate of the fluid flowback over a predefined time period that optimize a user-defined objective.

9. The method of claim 8, wherein the user-defined objective comprises minimizing a predicted amount of proppant degradation during the fracture closure stage of the fracturing operation.

10. A system for performing fluid flowback control, the system comprising:
at least one processor; and
a memory coupled to the processor having instructions stored therein, which when executed by the processor, cause the processor to perform functions, including functions to:
obtain information collected prior to a fracture closure stage of a fracturing operation of a formation;
determine, based on the information, whether to perform fluid flowback during the closure stage following a treatment stage of the fracturing operation; and
adjust, based on the determination, a rate of the fluid flowback during the fracture closure stage,
wherein learning classification is applied to predict whether the fluid flowback prevents proppant degradation associated with the fracturing operation.

11. The system of claim 10, wherein:
the information is selected from the group consisting of formation information gained prior to the treatment stage, time trajectories of system inputs during the treatment stage, measurements obtained during the treatment stage, and system parameters estimated based on the measurements; or the determination comprises at least one of a pattern-recognition-based determination, or a model-based determination.

12. The system of claim 11, wherein the determination comprises a pattern-recognition-based determination, wherein functions for the pattern-recognition-based determination performed by the processor include functions to:
obtain a first set of well fracturing system data of at least one of features and measured behavior of a well fracturing system for which the fracturing operation is initiated;
compare the first set of data with a second set of well fracturing system data of completed fracturing operations or with a classification rule resulting from the second set of well fracturing system data; and
initiate, based on the comparison, the adjustment of the rate of the fluid flowback during the fracture closure stage.

13. The system of claim 12, wherein the functions performed by the processor include functions to:
apply supervised learning classification to predict, based on the second set of data, whether the fluid flowback prevents proppant degradation associated with the fracturing operation.

14. The system of claim 11, wherein the determination comprises a model-based determination, wherein functions for the model-based determination performed by the processor include functions to:
create a model of a predicted well fracturing system behavior based on measurements obtained during the treatment stage of the fracturing operation of the formation; and
use the model of the predicted well fracturing system behavior and a user-defined objective to select the rate of the fluid flowback that optimizes the user-defined objective.

15. The system of claim 12, wherein the determination comprises a pattern-recognition-based determination, wherein functions for the pattern-recognition-based determination performed by the processor include functions to:
add, to a set of classifier training data, feature data extracted from a historical database related to completed fracturing operations;
extract features from the set of classifier training data;
train a classifier to predict whether to perform the fluid flowback during the fracture closure stage, based on the extracted features and identified classes related to the feature data, the identified classes comprise recommendation for fluid flowback associated with the completed fracturing operations; and
execute the classifier using a set of features describing the treatment stage of the fracturing operation to determine whether to perform the fluid flowback during the fracture closure stage.

16. The system of claim 11, wherein the determination comprises a model-based determination, wherein functions for the model-based determination performed by the processor include functions to:
obtain measurements from the initiated fracturing operation;
filter the measurements to remove a noise;
estimate and update unmeasured system states and model parameters based on the filtered measurements; and
determine, based on the updated system states and model parameters, a sequence of changes in the rate of the fluid flowback over a predefined time period that optimize a user-defined objective.

17. A non-transitory computer-readable storage medium having instructions stored therein, which when executed by a computer cause the computer to perform a plurality of functions, including functions to:
- obtain information collected prior to a fracture closure stage of a fracturing operation of a formation;
- determine, based on the information, whether to perform fluid flowback during the fracture closure stage following a treatment stage of the fracturing operation; and
- adjust, based on the determination to perform fluid flowback, a rate of the fluid flowback during the fracture closure stage,
- wherein learning classification is applied to predict whether the fluid flowback prevents proppant degradation associated with the fracturing operation.

18. The computer-readable storage medium of claim 17, wherein the instructions further perform functions to:
- obtain a first set of well fracturing system data of at least one of features and measured behavior of a well fracturing system for which the fracturing operation is initiated;
- compare the first set of data with a second set of well fracturing system data of completed fracturing operations or with a classification rule resulting from the second set of well fracturing system data; and
- initiate, based on the comparison, the adjustment of the rate of the fluid flowback during the fracture closure stage.

19. A method for performing a hydraulic fracturing operation comprising:
- initiating injection of a fracturing fluid into a formation via a wellbore in a treatment stage of a fracturing operation utilizing a pump truck;
- prior to a fracture closure stage of the fracturing operation following the treatment stage, determining whether conditions exist in a well fracturing system for implementation of fluid flowback procedures;
- upon a determination that fluid flowback procedures should be implemented in a well fracturing operation, determining an optimized flowback rate for the well fracturing system based on a predetermined objective; and
- operating the well fracturing system to achieve the optimized flowback rate,
- wherein learning classification is applied to predict whether the fluid flowback prevents proppant degradation associated with the fracturing operation.

20. The method of claim 19, further comprising utilizing the pump truck to control the rate of flowback from the wellbore.

* * * * *